(12) United States Patent  
Yamashita

(10) Patent No.: US 9,276,024 B2
(45) Date of Patent: Mar. 1, 2016

(54) SOLID-STATE IMAGING DEVICE AND METHOD OF MANUFACTURING THE SAME

(71) Applicant: Kabushiki Kaisha Toshiba, Minato-ku (JP)

(72) Inventor: Hirofumi Yamashita, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 296 days.

(21) Appl. No.: 13/798,838

(22) Filed: Mar. 13, 2013

(65) Prior Publication Data

US 2013/0193312 A1   Aug. 1, 2013

Related U.S. Application Data

(62) Division of application No. 12/848,469, filed on Aug. 2, 2010, now Pat. No. 8,435,823.

(30) Foreign Application Priority Data

Aug. 25, 2009 (JP) ................................. 2009-194544

(51) Int. Cl.
    *H01L 27/00* (2006.01)
    *H01L 27/146* (2006.01)

(52) U.S. Cl.
    CPC ...... *H01L 27/14603* (2013.01); *H01L 27/1464* (2013.01); *H01L 27/14632* (2013.01); *H01L 27/14685* (2013.01); *H01L 27/14687* (2013.01); *H01L 27/14621* (2013.01); *H01L 27/14627* (2013.01)

(58) Field of Classification Search
    CPC ................. H01L 27/1464; H01L 27/14601; H01L 27/14603; H01L 27/14621
    See application file for complete search history.

(56) References Cited

U.S. PATENT DOCUMENTS

2009/0311820 A1* 12/2009 Maruyama et al. ............. 438/70

FOREIGN PATENT DOCUMENTS

| JP | 1-270224 | 10/1989 |
| JP | 2003-31785 | 1/2003 |
| JP | 2005-268644 | 9/2005 |
| JP | 2006-128392 | 5/2006 |
| JP | 2006-261372 | 9/2006 |
| JP | 2006-286933 | 10/2006 |
| JP | 2007-234725 | 9/2007 |

OTHER PUBLICATIONS

Office Action issued Nov. 22, 2011, in Japanese Patent Application No. 2009-194544 (with English-language translation).
Office Action issued Feb. 7, 2012, in Japanese Patent Application No. 2009-194544 with English translation.

* cited by examiner

*Primary Examiner* — Tony Ko
(74) *Attorney, Agent, or Firm* — Oblon, McClelland, Maier & Neustadt, L.L.P.

(57) ABSTRACT

According to one embodiment, a method of manufacturing a back-illuminated solid-state imaging device including forming a mask with apertures corresponding to a pixel pattern on the surface of a semiconductor layer, implanting second-conductivity-type impurity ions into the semiconductor layer from the front side of the layer to form second-conductivity-type photoelectric conversion parts and forming a part where no ion has been implanted into a pixel separation region, forming at the surface of the semiconductor layer a signal scanning circuit for reading light signals obtained at the photoelectric conversion parts after removing the mask, and removing the semiconductor substrate and a buried insulating layer from the semiconductor layer after causing a support substrate to adhere to the front side of the semiconductor layer.

7 Claims, 6 Drawing Sheets ions at high energy from the front side of the Si substrate by use of a mask. At this time, the width of the p-well must be made extremely narrow. Therefore, the ion implantation mask must be so made that its aperture width is narrow and it is thickened to such a degree that it can withstand high energy. However, it is difficult to form a thick mask with a narrow aperture. The mask material sometimes stays behind on a part of the narrow aperture. In this case, the p-well is not formed as far as the light incident surface of the Si substrate, permitting crosstalk to occur due to the diffusion of photoelectrons. As a result, color mixture increases on the replay screen and therefore only reproduced images with deteriorated color reproducibility are obtained.

In addition, the pixel separation p-well formed by ion implantation from the front side of the substrate extends due to a scattering of ions at the back side of the substrate. The extension of the width of pixel separation on the light incidence side becomes a factor that increases crosstalk.

DETAILED DESCRIPTION

In general, according to one embodiment, there is provided a method of manufacturing a back-illuminated solid-state imaging device comprising forming a mask with apertures corresponding to a pixel pattern on the surface of a semiconductor layer in an element formation substrate; implanting second-conductivity-type impurity ions into the semiconductor layer from the front side of the layer to form second-conductivity-type photoelectric conversion parts and forming a part where no ion has been implanted into a pixel separation region; forming at the surface of the semiconductor layer a signal scanning circuit for reading light signals obtained at the photoelectric conversion parts after removing the mask; and removing the semiconductor substrate and a buried insulating layer from the semiconductor layer after causing a support substrate to adhere to the front side of the semiconductor layer.

Hereinafter, embodiments will be explained in detail with reference to the accompanying drawings.

First Embodiment

Figures 1, 2:
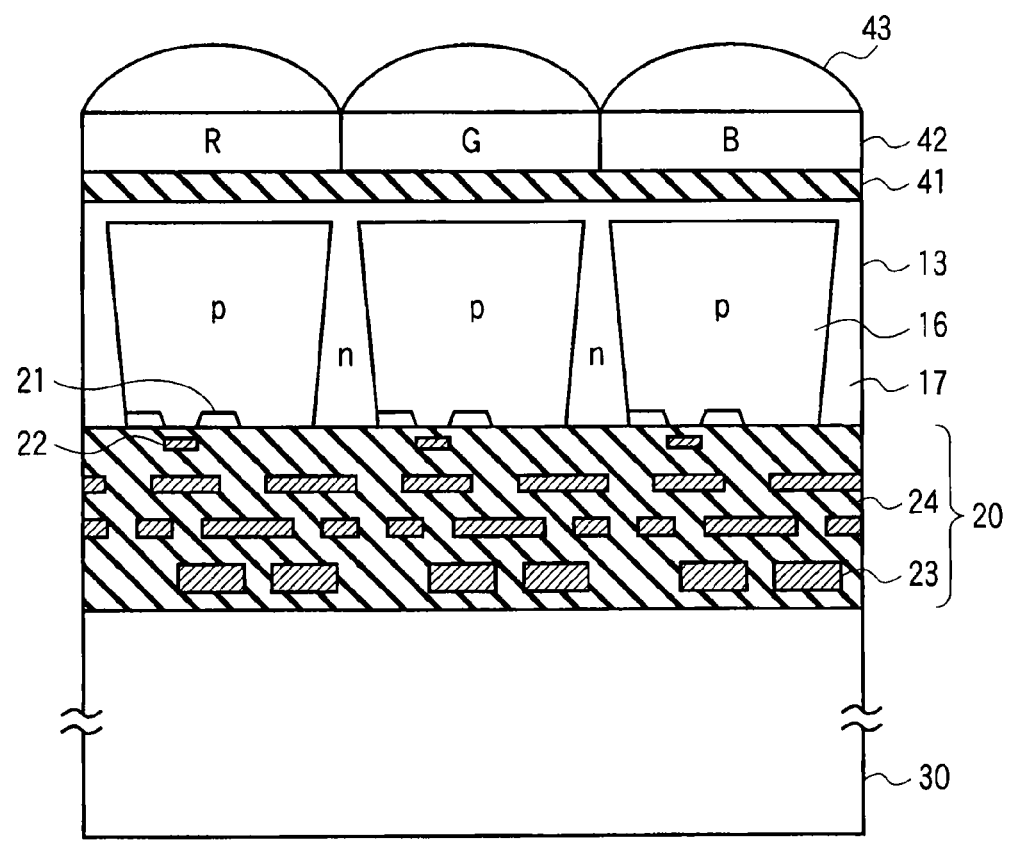
FIG. 1 is a sectional view showing an element structure of a back-illuminated MOS solid-state imaging device according to a first embodiment.
FIG. 2 shows an example of a color filter arrangement in the solid-state imaging device of FIG. 1.

FIG. 1 is a sectional view showing the configuration of a pixel part of a back-illuminated MOS solid-state imaging device according to a first embodiment.

In an Si layer (semiconductor substrate) 13, a plurality of p-type layers (photoelectric conversion parts) 16 corresponding to unit pixels are formed. The p-type layers 16 are separated pixel by pixel with an n-type layer (pixel separation region) 17. The n-type layer 17 is narrower in width on the back side (top surface) of the Si layer 13 than on the front side (under surface). The n-type layer 17 is formed shallowly near and throughout the back side of the Si layer 13.

In the p-type layer 16 at the front side of the Si layer 13, a signal scanning circuit is formed. The signal scanning circuit is composed of not only a charge storage layer 21 and a read transistor 22 but also an amplifying transistor, a vertical select transistor, a reset transistor, and the like (which are not shown). On the surface of the Si layer 13, there is provided an interconnection layer 20 which is composed of interconnections 23 electrically connected to the signal scanning circuit and an interlayer insulating film 24. A support substrate 30 is caused to adhere onto the interconnection layer 20.

On the back side of the Si layer 13, an Si nitride film 41 is formed. On the Si nitride film 41, color filters 42 are provided so as to correspond to the individual pixels. On the individual filters 42, microlenses 43 are provided. The arrangement of the color filters 42 is, for example, a Bayer arrangement as shown in FIG. 2.

In FIG. 2, a pixel indicated by R is a pixel provided with a color filter that transmits light mostly in the red wavelength region. A pixel indicated by G is a pixel provided with a color filter that transmits light mostly in the green wavelength region. A pixel indicated by B is a pixel provided with a color filter that transmits light mostly in the blue wavelength region. In this way, the color filters are arranged so that adjacent pixels pick up color signals differing from each other.

Figure 3:
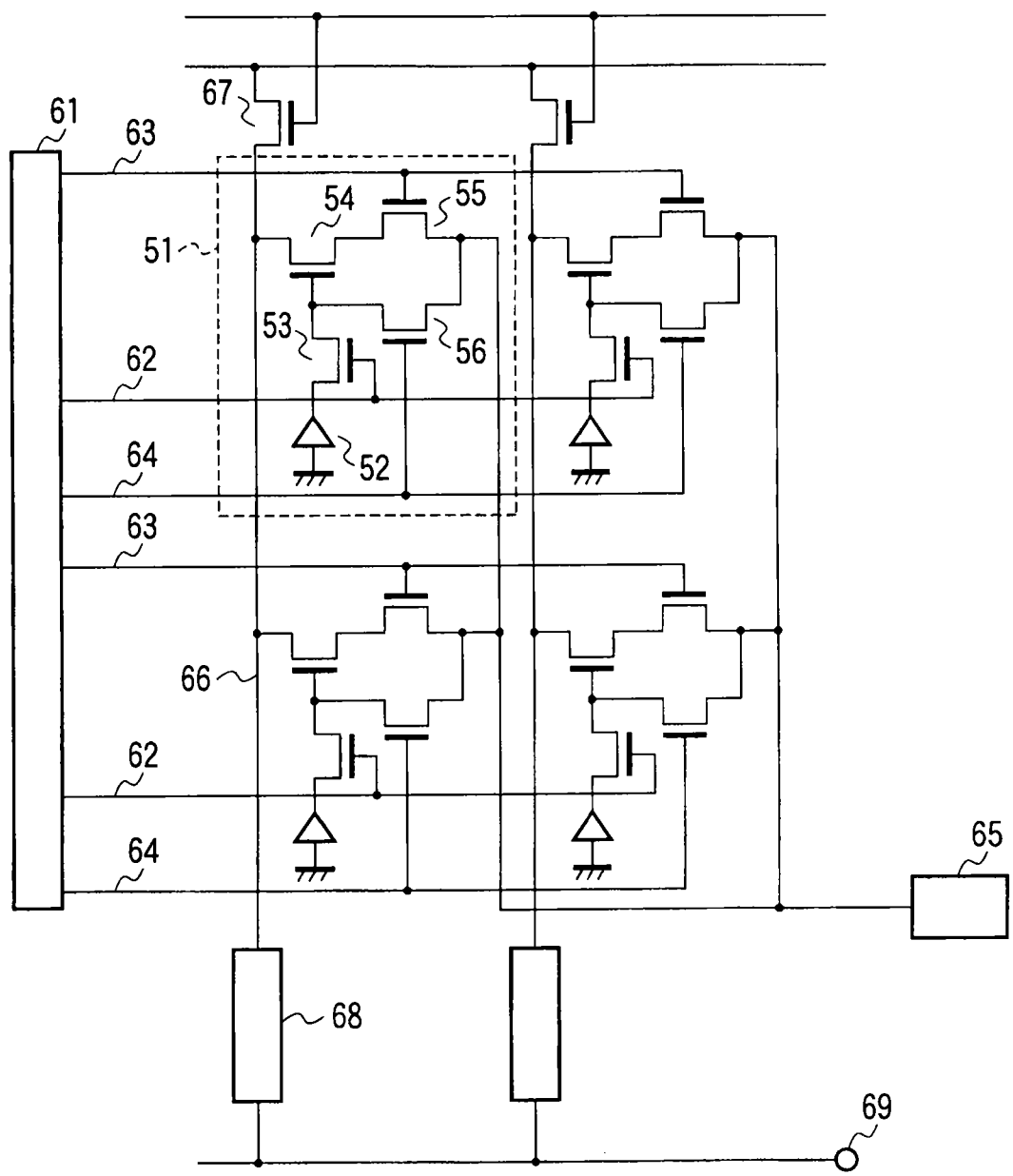
FIG. 3 shows a circuit configuration of the solid-state imaging device of FIG. 1.

FIG. 3 shows a part of the circuit configuration of the solid-state imaging device of FIG. 1.

In an imaging area, unit pixels 51 are arranged two-dimensionally. Each of the unit pixels 51 comprises a photodiode 52 for photoelectric conversion, a read transistor 53 for reading a signal in the photodiode 52, an amplifying transistor 54 for amplifying the read signal, a vertical select transistor 55 for selecting a line from which a signal is to be read, and a reset transistor 56 for resetting signal charges. Specifically, the size of the unit pixel 51 is determined by the photodiode 52. The read transistor 53, amplifying transistor 54, vertical select transistor 55, and reset transistor 56 constitute a signal scanning circuit. Although a 2×2 pixel arrangement has been used in FIG. 3 to simplify the explanation, more unit pixels than this are actually arranged.

A horizontal address line 63 runs horizontally from a vertical shift register 61, which is connected to the gate of the corresponding vertical select transistor 55, determines a line from which a signal is to be read. A read line 62 is connected to the gate of the corresponding read transistor 53. A reset line 64 is connected to the gate of the corresponding reset transistor 56. The common connection end of the vertical select transistor 55 and reset transistor 56 is connected to a power supply terminal 65.

The source of the amplifying transistor 54 is connected to a vertical signal line 66. A load transistor 67 is provided at one end of the vertical signal line 66. A horizontal signal line 69 is connected to the other end of the vertical signal line 66 via a CDS noise elimination circuit 68. The transistors 53, 54, 55, 56, 67 are of the p-type.

With this configuration, the select transistor 55 in a row to be read is turned on by a row select pulse sent from the vertical shift register 61. Then, the reset transistor 56 is turned on by a reset pulse similarly sent, resetting the potential of the floating diffused layer. Thereafter, the reset transistor 56 is turned off. Then, the read transistor 53 is turned on. Then, the signal charges accumulated in the photodiode 52 are read into the floating diffused layer. The potential of the floating diffused layer is modulated according to the number of signal charges read. The modulated signal is read onto the vertical signal line 66 by the amplifying transistor 54 that constitutes a source follower.

Next, a method of manufacturing the solid-state imaging device will be explained with reference to FIGS. 4A to 4F.

Figure 4A:
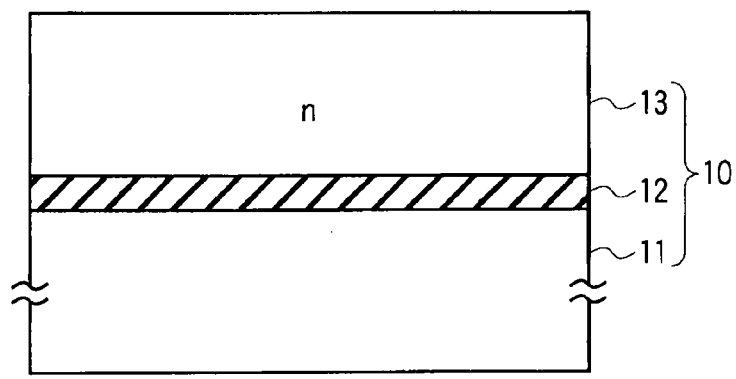
FIGS. 4A, 4B, 4C, 4D, 4E and 4F are sectional views to explain the process of manufacturing the solid-state imaging device of FIG. 1.

First, an SOI substrate 10 is prepared. In the SOI substrate 10, an Si layer (semiconductor layer) 13 is formed on an Si substrate (semiconductor substrate) 11 via a buried insulating film 13, such as a silicon dioxide film, as shown in FIG. 4A. The entire Si layer 13 of the SOI substrate 10 is doped with n-type impurities, such as P (phosphorus).

Figure 4B:
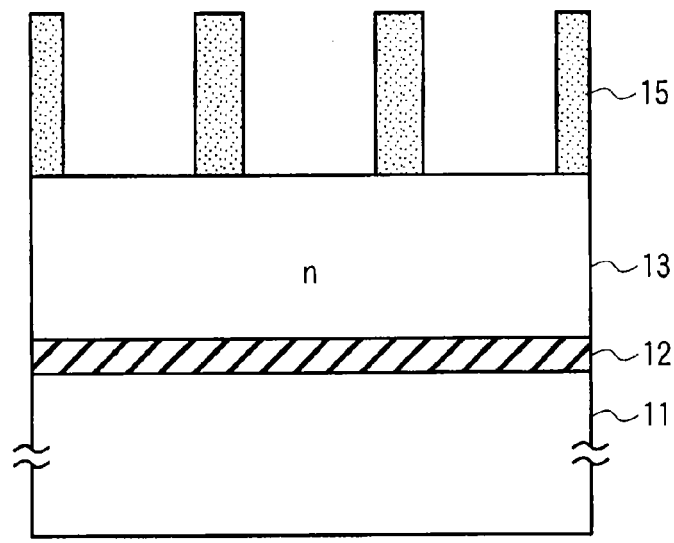

Next, as shown in FIG. 4B, on the surface of the Si layer 13, a mask 15 for a pixel separation pattern with apertures corresponding to a pixel pattern is formed. The mask 15 is formed by, for example, electric beam lithography. The mask 15 has a sufficient thickness and the area of the aperture part (pixel pattern) is greater than that of the masking part (pixel separation pattern).

Figure 4C:
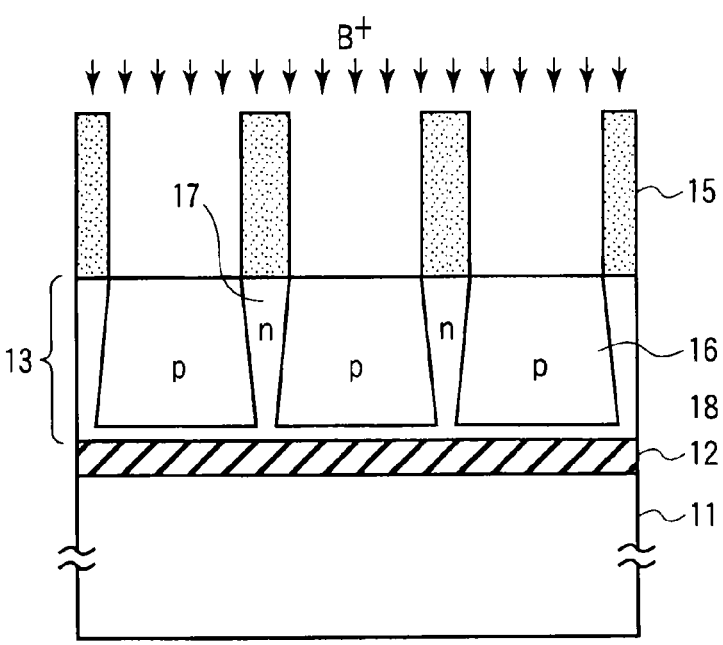

Next, as shown in FIG. 4C, with the mask 15, B (boron) ions are implanted into the Si layer 13, thereby forming a p-type layer (photoelectric conversion part) 16 in the Si layer 13. At this time, as a result of a scattering of ions in the Si layer 13, the width of the p-type layer 16 gets wider inside the substrate (on the back side) than on the front side of the substrate. A region into which B ions have been implanted becomes a p-type diffused layer, whereas the Si region into which no B ion has been implanted because of the shielding of the mask 15 remains as the n-type diffused layer. The part remaining as the n-type diffused layer is a pixel separation n-well (pixel separation region) 17. Unlike the photoelectric conversion part 16, the pixel separation region 17 is narrower inside the substrate (on the back side) than on the front side of the substrate.

The signal charges, which differ in polarity from that in the conventional art, act as holes. The maximum depth of ion implantation is set short of the back side of the Si layer 13, thereby enabling the shallow region of the back side part 18 of the Si layer 13 to be kept in the n-type layer. The n-type layer of the back side part 18 is effective in preventing dark current.

Figure 4D:
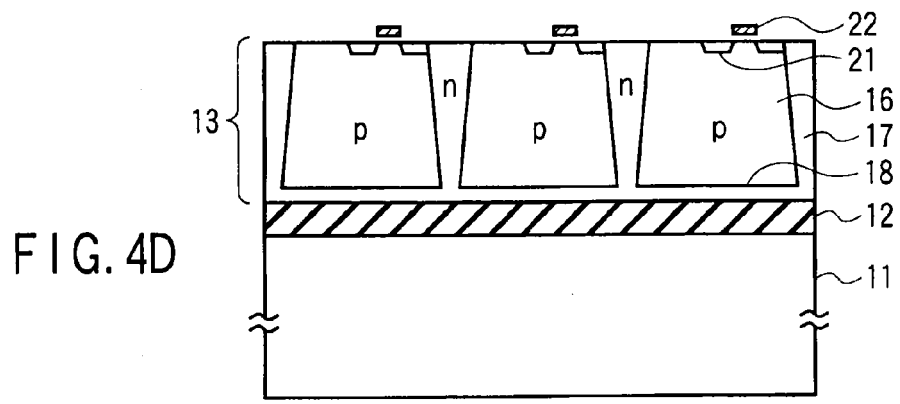

Next, as shown in FIG. 4D, after the mask 15 has been removed, a charge storage layer 21, the gates of read transistors 22, and the like are formed at the surface of the Si layer 13. Although not shown in FIG. 4D, the individual MOS transistors of FIG. 3 are formed in the Si layer 13. All of the MOS transistors are of the p-channel type.

Figure 4E:
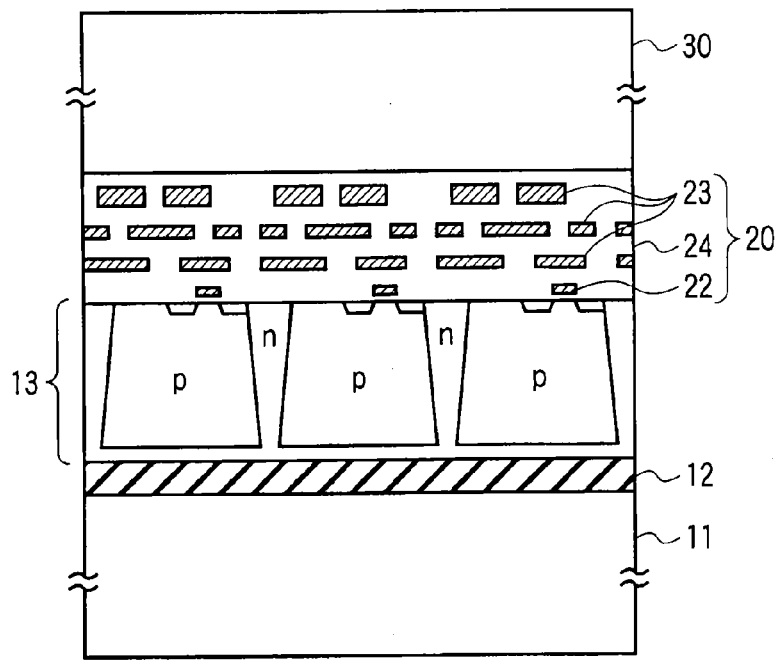

Then, as shown in FIG. 4E, an interconnection layer 20 composed of interconnections 23 and an interlayer insulating film 24 is formed at the surface of the Si layer 13 where the charge storage layer 21, various transistors, and the like have been formed. Then, a support substrate 30 is caused to adhere onto the interconnection layer 20. For example, the thermocompression bonding and the pressure crimp method can be used as a method of adhering support board 30 onto the interconnection layer 20.

Figure 4F:
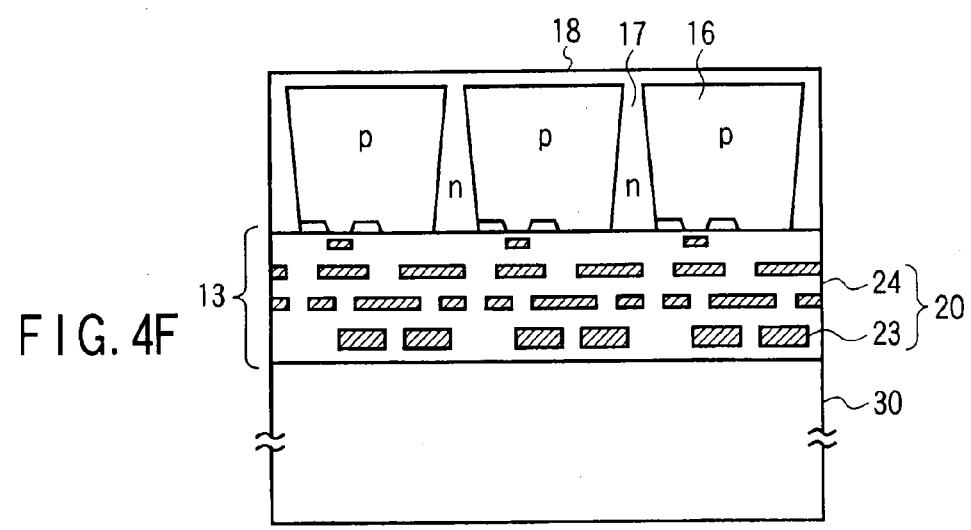

Next, as shown in FIG. 4F, the Si substrate 11 and buried insulating film 12 are peeled from the Si layer 13. From this point on, color filters 42 are formed via an Si nitride film 41 on the back side of the Si layer 13. In addition, microlenses 43 and others are formed, thereby producing a structure as shown in FIG. 1.

The effect of the first embodiment will be explained in comparison with a conventional method.

Figure 5A:
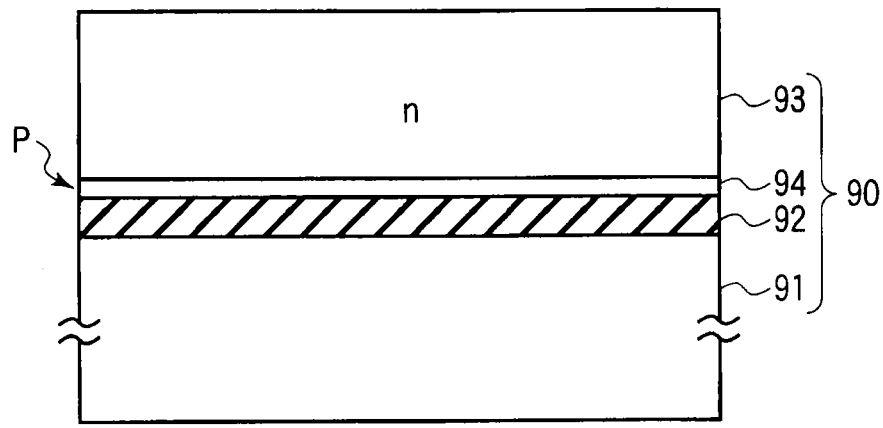
FIGS. 5A and 5B are sectional views to explain problems of comparison examples in processes.
Figure 5B:
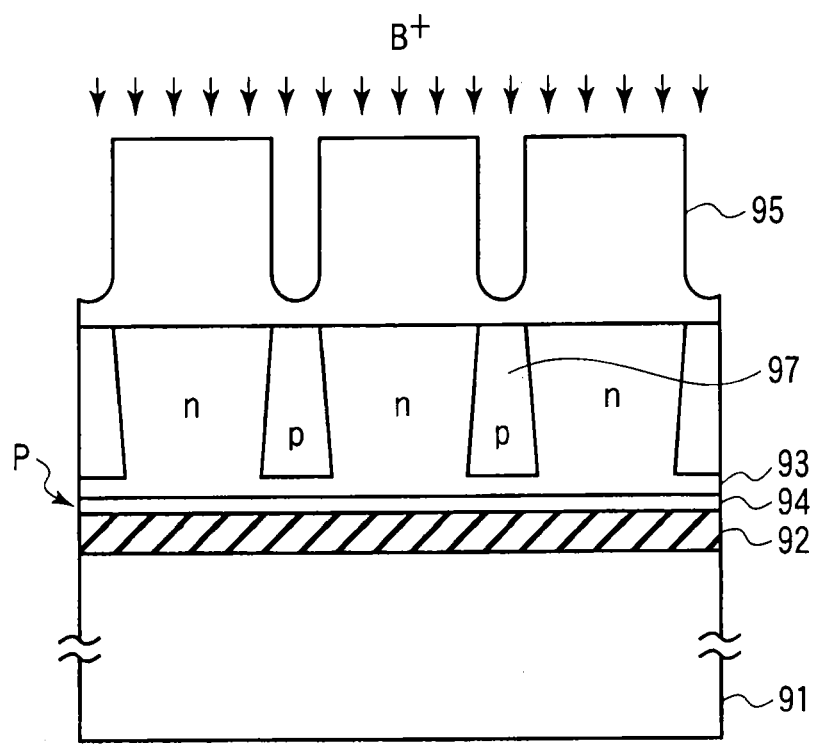

FIGS. 5A and 5B show the process of forming a pixel separation region by a conventional method. In the conventional method, an SOI substrate 90 in which an Si layer 93 has been formed above an Si substrate 91 via a buried insulating film 92 is prepared and the entire Si layer 93 is doped with n-type impurities as shown in FIG. 5A. In addition, a p-type layer 94 is formed near the boundary between the Si layer 93 and the buried insulating film 92.

Next, as shown in FIG. 5B, after a mask 95 with apertures corresponding to a pixel separation pattern has been formed, B ions are implanted, thereby forming a p-type layer (pixel separation region) 97 for pixel separation. The mask 95 for implanting ions to form the p-type layer 97 must have a narrow aperture width and be made sufficiently thick so as to withstand high-energy ion implantation. However, it is difficult to make a narrow aperture in a thick mask 95. When an attempt is made to make a narrow aperture in the thick mask 95, a part of the mask material stays behind at the aperture part as shown in FIG. 5B, which prevents ions from being implanted into a deep position of the Si layer. In this case, the p-type layer 97 is not formed as far as the optical incidence surface of the Si layer 93, permitting crosstalk to occur due to the diffusion of photoelectrons. As a result, light mixture increases on the replay screen and therefore only reproduced images with deteriorated color reproducibility are obtained.

In contrast, with the first embodiment, an n-well serving as a separation region between pixels is not formed by implanting n-type impurity ions, but is formed as a reverse pattern by implanting p-type impurity ions. That is, high-energy B ions are selectively implanted into a photodiode part of the Si layer 13 previously doped with n-type impurities, thereby forming a p-type layer 16. At this time, a pixel separation region is formed in a part that stays in the n-type without being reversed into the p-type.

Since apertures can be made sufficiently wide in the mask when B ions are implanted, the problem of permitting the mask material in ion implantation to stay behind at the mask aperture part will not arise. Accordingly, n-wells serving as pixel separation regions are formed separately as far as the illumination surface without problems, which prevents crosstalk from occurring due to thermal diffusion of charges generated by light. Therefore, good images with high color reproducibility are obtained on the replay screen.

The reason why the polarity of the photodiode in the first embodiment is made different from that in the conventional method is that the ion range of B (boron) is longer than that of P (phosphorus) used in forming an n-type diffused layer. That is, when the ion range is longer, a photodiode can be formed as far as a deeper position, which enables n-wells formed by reversal to be formed separately as far as the illumination surface. Even if P ions or the like are used, when ions can be implanted from the front side to back side of the Si layer, the charge storage part may be made of the n-type and the pixel separation region be made of the p-type.

In the examples of FIGS. 5A and 5B, the pixel separation layer is wider in a deeper position from the surface of the substrate (or in a part closer to the back side) due to the diffusion at the time of ion implantation. In this case, light incident on the back side of the substrate is converted photoelectrically at the pixel separation layer and the resulting charges enter the adjacent photoelectric conversion part, which becomes a factor that increases crosstalk.

In contrast, with the first embodiment, since the charge storage part is formed by ion implantation, the charge storage part is wider in a position closer to the back side of the substrate and the pixel separation layer, a reversal pattern of the charge storage part, is narrower in width in a position closer to the back side of the substrate. In this case, light incident on the back side of the substrate is hardly converted photoelectrically at the pixel separation layer, which enables the occurrence of crosstalk to be suppressed.

As described above, with the first embodiment, light is caused to enter the back side of the Si layer opposite the front side where the signal scanning circuit and its interconnection layer have been formed, light incident on the pixels can reach the light-receiving region formed in the Si layer without being impeded by the interconnection layer. Accordingly, when pixels are very small, a high quantum efficiency can be realized and a high signal-to-noise ratio can be maintained even if pixels are miniaturized further.

In addition, with the first embodiment, p-type impurity ions are implanted into the n-type Si layer 13, thereby separating pixels with a reversal pattern of the charge storage region. Therefore, even if the pixel size is decreased and therefore the pixel separation width is decreased, a well serving as an element separation region formed between pixels is formed continuously in the depth direction of the Si substrate until it reaches the illumination surface. Accordingly, crosstalk caused by the thermal diffusion of charges does not occur. As a result, high-resolution reproduced images with a high color reproducibility can be realized.

That is, even if the pixel size is decreased, pixels can be separated reliably and an increase in crosstalk resulting from the miniaturization of back-illuminated pixels can be prevented, which results in an improvement in the color reproducibility.

Second Embodiment

Figure 6A:
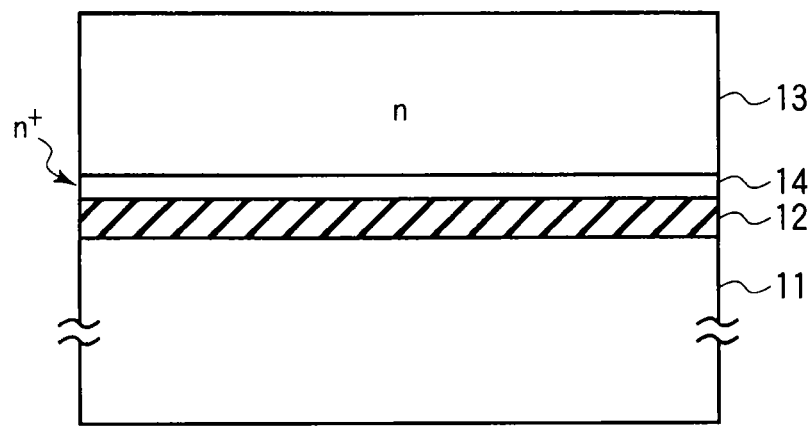
FIGS. 6A and 6B are sectional views to explain the process of manufacturing a back-illuminated MOS solid-state imaging device according to a second embodiment.
Figure 6B:
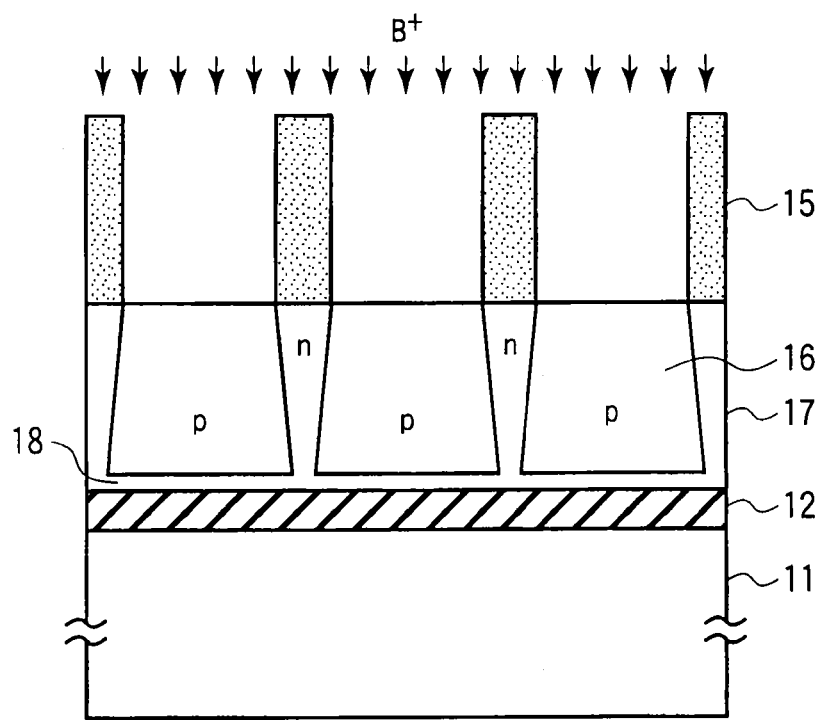

FIGS. 6A and 6B are sectional views to explain the process of manufacturing a back-illuminated MOS solid-state imaging device according to a second embodiment. The same parts as those in FIGS. 4A to 4F are indicated by the same reference numbers and a detailed explanation of them will be omitted.

The second embodiment differs from the first embodiment in that an n-well is formed in advance on the back side of the Si layer 13 of the SOI substrate 10.

As shown in FIG. 6A, an SOI substrate where an Si layer 13 has been formed via a buried insulating film 12 above an Si substrate 11 is prepared and the Si layer 13 is doped with n-type impurities. The entire Si layer 13 is doped uniformly with n-type impurities at a specific concentration (a first concentration) and the lower part 14 of the Si layer 13 is doped with n-type impurities at a high concentration (a second concentration). Specifically, after an $n^+$-type Si layer 14 has been formed on the insulating film 12, an n-type Si layer 13 is formed on the $n^+$-type Si layer 14. Alternatively, an $n^+$-type Si layer 14 may be formed by implanting ions into the Si layer 13 of the SOI substrate 10 at high energy.

Then, as shown in FIG. 6B, after a pixel separation pattern mask 15 has been formed on the surface of the Si layer 13, B ions are implanted. At this time, B ions may reach the back side of the Si layer 13. Since the back side of the Si layer 13 is of the $n^+$-type, even if the p-type impurities are doped to some extent, the back side of the substrate maintains the n-type.

From this point on, as in the first embodiment, a signal scanning circuit is formed, an interconnection layer 20 is formed, a support substrate 30 is caused to adhere, and color filters 42 and microlenses 43 are formed, which completes a solid-state imaging device configured as shown in FIG. 1.

Therefore, the second embodiment produces not only the same effect as that of the first embodiment but also the following effect. Before the mask 15 is formed, the lower part 14 of the Si layer 13 is doped with a high concentration of n-type impurities, which makes it unnecessary to control the depth of ion implantation accurately in implanting p-type impurity ions. This offers the advantage of increasing process flexibility in forming a p-well serving as a photoelectric conversion part.

Modification

The invention is not limited to the above embodiments. While in the embodiments, the photoelectric conversion parts and pixel separation regions have been of the p-type and of the n-type, respectively, the photoelectric conversion part and pixel separation regions may be of the n-type and of the p-type, respectively. The circuit configuration of the signal scanning circuit is not restricted to FIG. 3 and may be modified suitably according to the specification. In addition, the filter arrangement is not limited to the Bayer arrangement and may be changed suitably according to the specification.

Furthermore, the semiconductor substrate in which the photoelectric conversion parts are formed is not restricted to an Si substrate and other suitable semiconductor materials may be used instead.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A back-illuminated solid-state imaging device comprising:
   first-conductivity-type photoelectric conversion parts which are arranged in a plane direction in a semiconductor layer with a front side and a back side and correspond to unit pixels and which receive light incident on the back side of the semiconductor layer and generate signal charges, and becomes gradually wider in width from the front side toward the back side of the semiconductor layer;
   a signal scanning circuit which is provided at a surface of the semiconductor layer and which reads optical signals obtained at the photoelectric conversion parts; and
   a pixel separation region which is provided at a boundary region between adjacent pixels in the semiconductor layer and which is composed of a second-conductivity-type diffused layer and becomes narrower in width from the front side toward the back side of the semiconductor layer.

2. The device according to claim 1, wherein the semiconductor layer is doped uniformly with n-type impurities and the photoelectric conversion parts are formed by implanting p-type impurity ions.

3. The device according to claim 1, wherein an impurity diffused region of the same conductivity type as that of the pixel separation region is formed on the back side of the semiconductor layer so as to make contact with the pixel separation region.

4. The device according to claim 1, wherein color filters and microlenses are provided on the back side of the semiconductor layer so as to correspond to the photoelectric conversion parts.

5. The device according to claim 1, further comprising an interconnection layer composed of interconnections electrically connected to the signal scanning circuit and an insulating film formed on the surface of the semiconductor layer.

6. The device according to claim 5, further comprising a support substrate adhered on the interconnection layer.

7. The device according to claim 1, wherein the pixel separation region gets gradually narrower in width from the front side toward the back side of the semiconductor layer.

* * * * *